United States Patent [19]

Blandino

[11] Patent Number: 5,703,542
[45] Date of Patent: Dec. 30, 1997

US005703542A

[54] COMPACT TEMPERATURE STABILIZED CRYSTAL OSCILLATOR

[75] Inventor: Thomas P. Blandino, Cottage Grove, Wis.

[73] Assignee: Locus Incorporated, Madison, Wis.

[21] Appl. No.: 704,187

[22] Filed: Aug. 28, 1996

[51] Int. Cl.⁶ .................. H03B 5/04; H03B 5/36
[52] U.S. Cl. .................. 331/70; 331/66; 331/158; 361/704
[58] Field of Search .................. 331/44, 66, 67, 331/68, 69, 70, 158; 310/315, 318, 343; 361/688, 704, 711, 713

[56] References Cited

U.S. PATENT DOCUMENTS

| | | |
|---|---|---|
| 2,031,768 | 2/1936 | Gebhard .................. 331/69 X |
| 3,252,109 | 5/1966 | White .................. 331/69 |
| 4,985,687 | 1/1991 | Long .................. 331/70 X |
| 5,225,710 | 7/1993 | Westerkamp .................. 361/711 X |
| 5,309,320 | 5/1994 | Smith .................. 361/713 X |
| 5,397,917 | 3/1995 | Ommen et al. .................. 361/711 X |

*Primary Examiner*—David Mis
*Attorney, Agent, or Firm*—Quarles & Brady

[57] ABSTRACT

A compact temperature controlled crystal oscillator employs a high conductivity heat spreader bonded to one side of a printed circuit board into the crystal. Heaters are arranged at edges of the circuit board and a temperature sensor for the temperature regulation circuitry is centered in the circuit board with components of high thermal sensitivity being placed in zones closer to the temperature sensor. An operating temperature of the heat spreader is selected by measuring multiple operating temperatures at different ambient temperatures and picking an operating temperature that causes a least absolute frequency deviation.

11 Claims, 1 Drawing Sheet

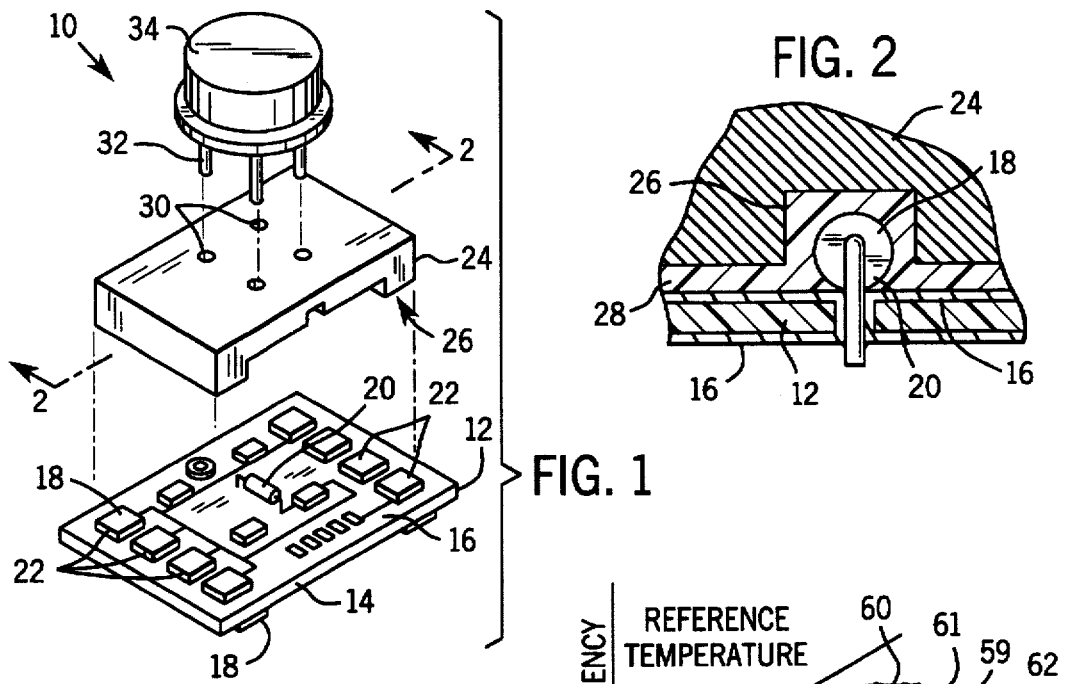

5,703,542

1

COMPACT TEMPERATURE STABILIZED CRYSTAL OSCILLATOR

FIELD OF INVENTION

The present invention relates to crystal controlled electrical oscillators and in particular to such oscillators having a temperature controlled environment for the crystal and oscillator circuitry.

BACKGROUND OF THE INVENTION

Crystal controlled oscillators are well known for use as high accuracy time references. Such oscillators make use of a cut wafer of a piezoelectric crystal, typically quartz, which is used in an electrical circuit to accurately control the frequency of the circuits electrical oscillation.

The frequency of oscillation of such a crystal is sensitive to temperature, and therefore, for extremely accurate oscillators it is known to place the crystal in an "oven" that provides a chamber regulated to a particular temperature. The crystal and associated circuitry may be placed within this chamber thereby reducing the effects of changes in ambient temperature (i.e. temperatures outside the oven) on the frequency of the oscillator. Insulation may be added around the outside of the oven to further reduce these effects of ambient temperature.

Such ovens for controlling the temperature of the crystal are relatively bulky and complex. For this reason, for many applications, particularly where a compact oscillator is required, it is known to provide instead a temperature compensating circuit which shifts the frequency of the crystal (by changes of other circuit elements) by an amount equal but opposite to the expected shift of frequency caused by temperature change. Unfortunately the temperature dependency of each crystal varies and hence this compensation is difficult.

SUMMARY OF THE INVENTION

The present invention provides an extremely compact yet highly accurate crystal oscillator in which a circuit board holding temperature sensitive components is mounted against a metallic heat spreader that is also attached to the crystal. Heaters and a temperature sensor control the temperature of this heat spreader.

A small amount of variation in temperature of the crystal and components occurs with the heat spreader design, but is minimized in two ways. First, temperature sensitive components are arranged in tiers about the temperature sensor according to their temperature sensitivity: the most sensitive components are placed closest to the temperature sensor where the thermal regulation is best. Second, the temperature to which the heat spreader is regulated ("regulated temperature") is based on a measurement of frequency of the oscillator as a function both of ambient temperature and regulated temperature. A regulated temperature is selected which minimizes changes in frequency over the expected range of ambient temperatures.

Specifically the present invention provides a temperature stabilized crystal oscillator having a circuit board with a plurality of heaters mounted on it. Heater control circuitry including a temperature sensor is also mounted on the circuit board and communicate with the heaters to control the heaters and to provide a predetermined temperature at the temperature sensor. Crystal driving circuitry is also mounted to the circuit board to electrically drive a tuned crystal at a predetermined frequency. A solid heat spreader is attached to

2 the tuned crystal and positioned against the circuit board in thermal communication with the heaters and at least a portion of the crystal driving circuitry.

Thus, it is one object of the invention to provide an extremely compact temperature controlled crystal oscillator. The use of the solid heat conductor laid along the top of the circuit board and the heating elements provides a simple and low profile solution to temperature regulation.

The temperature sensor may be centered among the heaters which are arranged along the edges of the printed circuit board and the temperature sensitive components may be arranged around the temperature sensor in accordance with their temperature sensitivities. The upper surface of the solid heat conductor may be notched to conform with the upper surface of the heater and attached thereto with heat conductive but electrically insulating adhesive.

Thus, it is another object of the invention to minimize the effects of small changes in temperature on the crystal oscillator thereby permitting this simplicity of design.

The effect of small variation in component temperature permitted by this design may be further minimized by a particular trimming method. The oscillator is first exposed to a mean environmental temperature within its range, its temperature regulated to different trial regulation temperatures about a nominal centered temperature and its frequency as a function of the trial regulation temperatures is checked. The minimum slope of the functional relationship between frequency and trial regulation temperature determines a true centered temperature. Next the oscillator is exposed to a low and high environmental temperature within its range and its frequency at each environmental temperature is again measured at a number of trial regulation temperatures about the true centered temperature. A final regulation temperature is selected from the plurality of trial regulation temperatures so that the difference between the frequencies at the high and low environmental temperatures is minimized.

Thus, it is another object of the invention to reduce the effective temperature dependency of a particular crystal. By selecting the control temperature to minimize frequency shift, the need for extensive thermal isolation and regulation is avoided.

The foregoing and other objects and advantages of the invention will appear from the following description. In this description, reference is made to the accompanying drawings which form a part hereof and in which there is shown by way of illustration, a preferred embodiment of the invention. Such embodiment does not necessarily represent the full scope of the invention, however, and reference must be made therefore to the claims for interpreting the scope of the invention.

BRIEF DESCRIPTION OF THE DRAWINGS

FIG. 1 is an exploded perspective view of the crystal oscillator of the present invention showing a crystal held in a metal can as may be attached to the top of a copper heat spreader which fits against the top of a circuit board holding oscillator electric components including a temperature sensor;

FIG. 2 is a fragmentary cross-section taken along line 2—2 of FIG. 1 showing a lower surface of the heat spreader as is notched to conform to a component on the printed circuit board and as is attached to the printed circuit board with a heat conductive material;

FIG. 3 is simplified plan view of the circuit board of FIG. 1 showing locations of the heater elements on that circuit board and showing zones of progressively greater heat regulation accuracy toward the center of the board where a heat sensor is located;

FIG. 4 is a block diagram of a temperature controlled oscillator suitable for use in the present design showing heaters communicating with oscillator circuitry via the heat spreader; and FIG. 5 is a three dimensional graph showing reference temperature, ambient temperature and frequency showing the criteria for selecting of the regulation temperature for the heat spreader as may be determined by temperature measurements at multiple ambient temperature levels.

DETAILED DESCRIPTION OF THE PREFERRED EMBODIMENT

Referring to FIG. 1, the temperature stabilized crystal oscillator 10 of the present invention includes a four-layer printed circuit board 12 having a fiberglass core 14 with etched copper traces 16 on a top and bottom face. Oscillator components 18 are attached to both surfaces of the printed circuit board 12 and interconnected by the traces 16 as is well understood in the art. The printed circuit board is approximately one-sixteenth inch thick.

Centered in the upper surface of the printed circuit board 12 is a temperature sensor 20 which in the preferred embodiment is a silicon PTC temperature sensor which communicates with a heater control circuit as will be described to control the temperature measured by the sensor 20.

Flanking the temperature sensor 20 on a left and right side of the board are eight heating elements 22 which in the preferred embodiment are transistors arranged in parallel rows. Four heating elements are equally spaced in lines along the left side of the printed circuit board 12 and four heating elements are equally spaced in lines along the right side of the printed circuit board 12 so as to define an area between them in which all other circuitry of that side may be placed. The heating elements 22 are arranged in opposing parallel lines to promote substantially linear isothermal lines 51 and to thereby minimize hot spots on the printed circuit board 12.

Referring also to FIG. 4, the temperature sensor 20 is connected to an inverting input of a heater driver amplifier 36 which receives, at its positive input, an adjustable reference voltage 38 whose value may be determined as will be described below. The difference between the signals drives a set of parallel connected transistors whose internal heat dissipation together with that of their emitter resistors 40 form the heating elements 22 and provide heat to a heat spreader 24 attached to their upper surfaces as will be described. The feedback loop provided by the sensor 20 and the amplifier 36 regulates the temperature of the heat spreader 24 to a regulation temperature determined by reference voltage 38 with a high degree of accuracy.

Also attached to the printed circuit board 12 is oscillator crystal 34 which has leads passing through holes 30 in the heat spreader 24 and connected to one or more traces 16 of the printed circuit board 12. These holes are drilled after the heat spreader 24 has been attached to the printed circuit board 12 (as will be described) and are located by guide holes in the traces 16. The oscillator crystal 34 is driven by oscillator drive circuitry 42 of conventional design which provides an output signal at a terminal 44 having a particular frequency.

Referring now again to FIGS. 1 and 2, the heat spreader 24 fits closely on top of the upper surface of the printed circuit board 12 resting on the heating elements 22. The heat spreader 24 has notches 26 in its lower surface to accommodate various of the components 18 on the upper surface of the board including the temperature sensor 20. The heat spreader 24 may be an approximately eighth inch thick copper strip attached to the upper surface of the printed circuit board 12 about the components 18 by an epoxy 28 that is loaded with aluminum nitride to be heat conducting but electrically insulating.

Three holes 30 are bored through the heat spreader 24 to allow leads 32 of the oscillator crystal 34 to attach to the remaining circuitry. The oscillator crystal 34 is held in a metal can as is understood in the art, the bottom surface of which is thus attached to an upper surface of the heat spreader 24. A heat conducting grease, as is well understood in the art, may be placed between the crystal 34 and the upper surface of the heat spreader 24 to improve the thermal conductivity therebetween.

Thus the components 18 and the oscillator crystal 34 are in close thermal communication with the heat spreader 24. The heat spreader 24 receives heat from the heating elements 22 and communicates it to the crystal 34 and portions of its driving circuitry 42, the heating circuitry of reference voltage 38, amplifier 36 and sensor 20.

Referring now to FIG. 3, although the heat spreader 24 has extremely low thermal resistance, and thus provides a high degree of thermal uniformity to all of the components 18 which touch it, there is some thermal resistance between the heating elements 22 and the temperature sensor 20. For this reason zones 50 immediately adjacent to the temperature sensor 20 will have the highest accuracy of temperature regulation, with zones 52 and 54, each successively further away from sensor 20, having less accurate regulation of temperature. Thus generally, changes in the ambient temperature will effect zone 54 by the greatest amount and zone 50 be the least amount.

The present invention, recognizing this phenomenon, places components 18 having greatest temperature sensitivity in zone 50 with components having lower temperature dependencies in zones 52 and 54, respectively. Temperature dependency is determined as the change in frequency of the crystal oscillator 10 expected if the temperature of the component changes by a predetermined amount. Thus, highly temperature dependent components will typically be either those components which have values that change significantly as their temperature changes or those components whose placement in the circuit makes even small changes in value significant with respect to the frequency of the crystal oscillator 10.

This tiering of components enables use of the low profile heat spreader design of the present invention where components 18 are not wholly shielded from changes in ambient temperature.

Components 18 having relatively little temperature dependence or whose values are not critical for the frequency of the crystal oscillator 10 may be placed on the bottom side of the board as shown in FIG. 1.

The ability of the crystal oscillator 10 to provide a constant frequency at its output terminal 44 in the face of changing ambient temperatures is also further improved by adjusting the reference voltage 38 to produce a reference temperature of the heat spreader 24 that renders the crystal 34 least sensitive to temperature changes. Generally each crystal has a somewhat different functional dependence on its temperature. Ideally the reference voltage 38 is set to a flat point in this temperature dependence so that minor changes in the temperature of the crystal 34 produce only minor frequency changes in the output at terminal 44.

Referring now to FIG. 5, in the present invention, the reference temperature of the heat spreader 24 is set with a trimming process. In the first step of this trimming process, the crystal oscillator 10 is placed in an ambient temperature of approximately 22° C. (room temperature) and the reference temperature of the heat spreader 24 is set to a "nominal centered temperature" 59 specified by the manufacturer of the crystal 34. This nominal centered temperature 59 is that temperature at which the local maximum or local minimum resonant frequency of the crystal 34 is expected and is normally a temperature somewhat greater than the highest ambient temperature at which the oscillator is rated, typically 75° C.

Trial regulation temperatures of the heat spreader 24 are next tried on either side of this nominal centered temperature (e.g., 72° C. and 78° C.) and a curve is fit to these points to determine a true centered temperature 61 at which the slope of the function of regulation temperature and frequency of the crystal 34 is minimized.

The crystal oscillator 10 is then cooled to a low temperature in its operating range, typically −25° C. At this low temperature, a variety of different trial regulation temperatures on either side of the true centered temperature 61 are tried by changing reference voltage 38 and the frequency at output terminal 44 is measured as indicated by plot 60. A curve is fit to these trial regulation temperatures to provide frequency values for a continuous set of regulation temperature points.

The crystal oscillator 10 is then heated to a high temperature within its operating range, in this case 65° C. and different trial regulation temperatures are again set on either side of the true centered temperature 61 by adjusting the reference voltage 38. Again, each of these trial regulation temperatures will produce a different output frequency at terminal 44 as indicated by plot 62. A curve fit is again used to expand the trial regulation temperatures into frequency values for a continuous set of regulation temperature points.

At the conclusion of this test, triplets of measurements (sharing a single trial regulation temperature) one measurement each from the continuous sets of regulation temperatures for each of the high, low and room temperatures, are compared and a final regulation temperature is selected according to the triplet 66 that provides the least variation in frequency at the low and high and room temperature.

Thus, regardless of the particular functional dependence of the crystal and the components 18 of the crystal oscillator 10, an oven temperature may be selected which minimizes the susceptibility of the crystal oscillator 10 to changes in ambient temperature.

The above description has been that of a preferred embodiment of the present invention. It will occur to those that practice the art that many modifications may be made without departing from the spirit and scope of the invention. In order to apprise the public of the various embodiments that may fall within the scope of the invention, the following claims are made:

I claim:

1. A temperature stabilized crystal oscillator comprising:
   a circuit board;
   at least one heater mounted to the circuit board;
   heater control circuitry including a temperature sensor mounted to the circuit board and communicating with the heater to control it to provide a predetermined temperature at the temperature sensor;
   a tuned crystal;
   crystal driving circuitry mounted to the circuit board to electrically drive the tuned crystal at a predetermined frequency; and
   a solid heat spreader in thermal communication with the tuned crystal, the circuit board, the heater, the temperature sensor, and at least a portion of the crystal driving circuitry.

2. The temperature stabilized crystal oscillator of claim 1 wherein there are a plurality of heaters are positioned along edges of the circuit board and the temperature sensor is centered among the heaters.

3. The temperature stabilized crystal oscillator of claim 1 wherein there are a plurality of heaters arranged in at least two parallel opposed lines.

4. The temperature stabilized crystal oscillator of claim 1 wherein the crystal driving circuitry includes components having differing temperature dependencies and wherein the components are arranged about the temperature sensor with components having greatest temperature dependencies being closest to the temperature sensor.

5. The temperature stabilized crystal oscillator of claim 4 wherein components having the least temperature dependencies are mounted on a side of the circuit board away from the solid heat spreader.

6. The temperature stabilized crystal oscillator of claim 1 wherein the solid heat spreader is a metal plate.

7. The temperature stabilized crystal oscillator of claim 1 wherein the solid heat spreader has one side notched to conform with upper surfaces of at least one of the group consisting of the heaters, the portion of the crystal driving circuitry, or the temperature sensor, and wherein the solid heat spreader is attached to the circuit board by heat conductive, but electrically insulating material, and wherein the tuned crystal is attached to a surface of the solid heat spreader removed from the circuit board.

8. A method of trimming a temperature stabilized crystal oscillator for operating in an environmental temperature range and having:
   a circuit board;
   at least one heater mounted to the circuit board;
   heater control circuitry including a temperature sensor mounted to the circuit board and communicating with the heater to control the heater to provide a predetermined temperature at the temperature sensor;
   a tuned crystal;
   crystal driving circuitry mounted to the circuit board to electrically drive the tuned crystal at a predetermined frequency; and
   a solid heat spreader attached to the tuned crystal and positioned to abut the circuit board in thermal communication with the heater, at least a portion of the crystal driving circuitry, and the temperature sensor, the method comprising the steps of:
   (a) identifying a centered temperature to which the heat spreader will be regulated;
   (b) exposing the oscillator to a mean environmental temperature of the temperature range and measuring frequencies at a plurality of trial regulation temperatures about the nominal centered temperature;
   (c) fitting a curve to the measured frequencies and trial regulation temperatures; and
   (d) selecting a regulation temperature from among the plurality of trial regulation temperatures in a region of minimized slope in the fitted curve.

9. A method of trimming a temperature stabilized crystal oscillator for operating in an environmental temperature range and having:

a circuit board;

at least one heater mounted to the circuit board;

heater control circuitry including a temperature sensor mounted to the circuit board and communicating with the heater to control the heater to provide a predetermined temperature at the temperature sensor;

a tuned crystal;

crystal driving circuitry mounted to the circuit board to electrically drive the tuned crystal at a predetermined frequency; and a solid heat spreader attached to the tuned crystal and positioned to abut the circuit board in thermal communication with the heater, at least a portion of the crystal driving circuitry, and the temperature sensor, the method comprising the steps of:

(a) identifying a centered temperature to which the heat spreader may be regulated;

(b) exposing the oscillator to a first environmental temperature of the temperature range and measuring first frequencies at a plurality of regulation temperatures about the centered temperature;

(c) exposing the oscillator to at least one second environmental temperature of the temperature range measuring second frequencies at the plurality of trial regulation temperatures about the centered temperature; and (d) selecting a final regulation temperature from among the plurality of trial regulation temperatures to minimize the difference between the corresponding first and second frequencies for the selected final regulation temperature.

10. The method of claim 9 wherein the first environmental temperature is the lowest temperature of the temperature range and the second environmental temperatures are a middle and highest temperature of the temperature range.

11. The method of claim 9 wherein the step of identifying of a centered temperature includes the steps of:

(a) exposing the oscillator to a mean environmental temperature of the temperature range and measuring frequencies at a plurality of trial regulation temperatures about a nominal centered temperature;

(c) fitting a curve to the measured frequencies and trial regulation temperatures; and (d) selecting a centered temperature from among the plurality of trial regulation temperatures at a region of minimum slope in the fitted curve.

* * * * *